(12) United States Patent
Takei et al.

(10) Patent No.: US 8,546,823 B2
(45) Date of Patent: Oct. 1, 2013

(54) LIGHT EMITTING DEVICE AND ILLUMINATION APPARATUS INCLUDING SAME

(75) Inventors: Naoko Takei, Osaka (JP); Kouji Nishioka, Tottori (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/523,918

(22) Filed: Jun. 15, 2012

(65) Prior Publication Data
US 2012/0319143 A1  Dec. 20, 2012

(30) Foreign Application Priority Data
Jun. 16, 2011  (JP) .................. 2011-134342

(51) Int. Cl.
*H01L 29/18*  (2006.01)

(52) U.S. Cl.
USPC ...................................... 257/88; 257/E27.12

(58) Field of Classification Search
USPC .............................................. 257/88, E27.12
See application file for complete search history.

(56) References Cited

U.S. PATENT DOCUMENTS

| | | | |
|---|---|---|---|
| 7,926,973 B2 * | 4/2011 | Harada | 362/231 |
| 2003/0214233 A1 | 11/2003 | Takahashi et al. | |
| 2006/0038187 A1 | 2/2006 | Ueno | |
| 2008/0284315 A1 | 11/2008 | Tasumi et al. | |
| 2011/0058369 A1 | 3/2011 | Imamura et al. | |
| 2012/0274203 A1 * | 11/2012 | Yokotani | 313/512 |
| 2012/0299463 A1 * | 11/2012 | Kume | 313/498 |
| 2013/0126918 A1 * | 5/2013 | Hsieh et al. | 257/89 |

FOREIGN PATENT DOCUMENTS

| | | |
|---|---|---|
| JP | 2004-111882 | 4/2004 |
| JP | 2005-340472 | 12/2005 |
| JP | 2006-49735 | 2/2006 |
| JP | 2009-231785 | 10/2009 |
| JP | 2010-118531 | 5/2010 |
| JP | 2011-60967 | 3/2011 |

* cited by examiner

*Primary Examiner* — Trung Q Dang
(74) *Attorney, Agent, or Firm* — Renner, Otto, Boisselle & Sklar, LLP

(57) ABSTRACT

A light emitting device includes a plurality of solid-state light emitting elements mounted on a substrate; and a wavelength converting unit covering the solid-state light emitting elements, the wavelength converting unit containing fluorescent materials. The solid-state light emitting elements include inner solid-state light emitting elements arranged in a central position of the substrate and outer solid-state light emitting elements arranged outwardly of the inner solid-state light emitting elements, and the wavelength converting unit is configured such that a probability that light propagating through the wavelength converting unit is brought into contact with the fluorescent materials in a portion of the wavelength converting unit covering the outer solid-state light emitting elements is lower than a probability that light propagating through the wavelength converting unit is brought into contact with the fluorescent materials in other portions.

7 Claims, 5 Drawing Sheets

X: PROBABILITY THAT LIGHT PROPAGATING THROUGH WAVELENGTH CONVERTING UNIT IS BROUGHT INTO CONTACT WITH FLUORESCENT MATERIALS
$X_A < X_B$

COLOR TEMPERATURE
$L_B < L_A \fallingdotseq L_B + L_C < L_C$

X: PROBABILITY THAT LIGHT PROPAGATING THROUGH WAVELENGTH CONVERTING UNIT IS BROUGHT INTO CONTACT WITH FLUORESCENT MATERIALS $X_A < X_B$

B: WHITE LIGHT WHOSE COLOR TEMPERATURE IS LOW
C: WHITE LIGHT WHOSE COLOR TEMPERATURE IS HIGH

LIGHT EMITTING DEVICE AND ILLUMINATION APPARATUS INCLUDING SAME

FIELD OF THE INVENTION

The present invention relates to a light emitting device in which solid-state light emitting elements are mounted on a substrate, and an illumination apparatus including same.

BACKGROUND OF THE INVENTION

Light sources such as incandescent lamps, fluorescent lamps, high voltage discharge lamps and the like have been conventionally used for illumination apparatuses. In recent years, light emitting diode (LED) light sources have come into wide use because of their low power consumption and high durability. Since one LED element emits a low light flux, an LED light source uses a plurality of LED elements to obtain substantially the same light flux as conventional light sources. There is a trend to mount LED elements on a substrate as compact as possible to realize a high power LED light source.

An example of such an LED light source may includes a white LED light source which mixes blue light and yellow light to generate white light by coating a resin layer, which contains a fluorescent material to convert the blue light into the yellow light, on a substrate LED element to emit the blue light. There have been proposed various arrangements of fluorescent materials on such an LED substrate from the viewpoint of ease manufacturability and the small amount of fluorescent materials used. Examples of such arrangement of fluorescent materials are shown in FIGS. 6A to 6F.

Figure 6A:
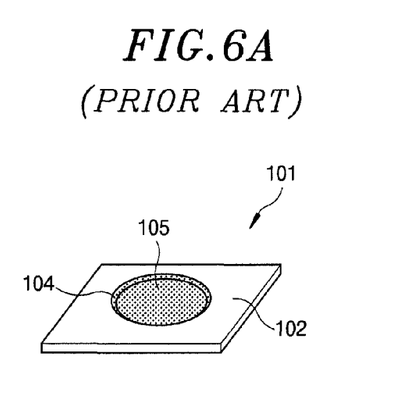
FIGS. 6A to 6F are perspective views and sectional views of conventional LED light sources.
Figure 6B:
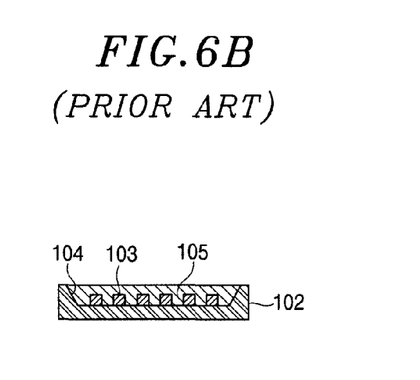
Figure 6C:
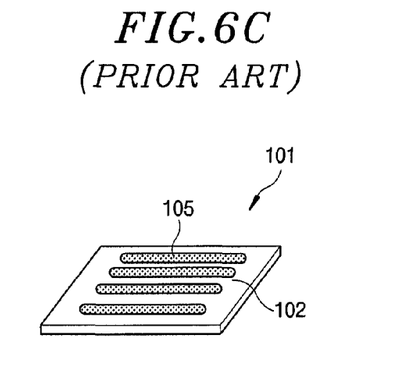
Figure 6D:
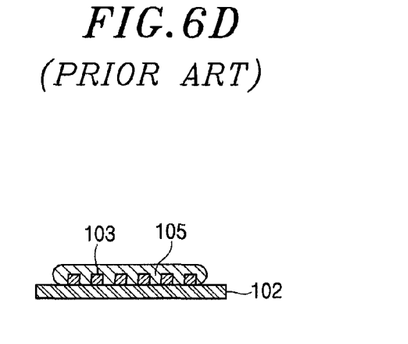
Figure 6E:
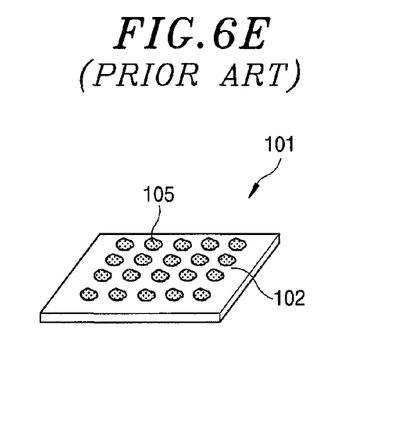
Figure 6F:
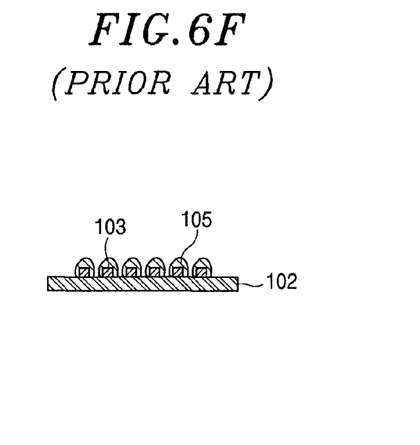

As one example, as shown in FIGS. 6A and 6B, an LED light source 101 may include a plurality of LED elements 103 mounted on a circular concave portion 104 formed on a substrate 102, and a fluorescent layer 105 formed in the concave portion 104. As another example, as shown in FIGS. 6C and 6D, the LED light source 101 may include a plurality of LED elements 103 and fluorescent layers 105 coated in the form of line on the LED elements 103. As still another example, as shown in FIGS. 6E and 6F, the LED light source 101 may include a plurality of LED elements 103 and fluorescent layers 105 potted on the LED elements 103.

Figure 7:
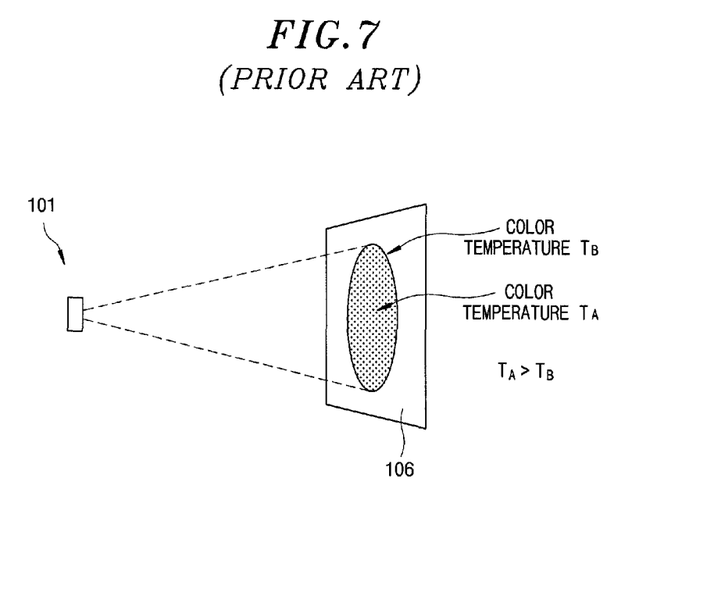
FIG. 7 is a perspective view used to explain an irradiation pattern of the conventional LED light sources.

An example of an irradiation pattern of the above-configured LED light source is shown in FIG. 7. In some cases, the irradiation pattern in which light is irradiated to an irradiation surface 106 may show that the color temperature "$T_A$" of light in the central portion of the irradiation surface 106 is higher than the color temperature "$T_B$" of light in the periphery of the irradiation surface 106 and the color temperature decreases from the central portion toward the periphery. The reason for the above will be described below with reference to FIGS. 8A and 8B.

Figure 8A:
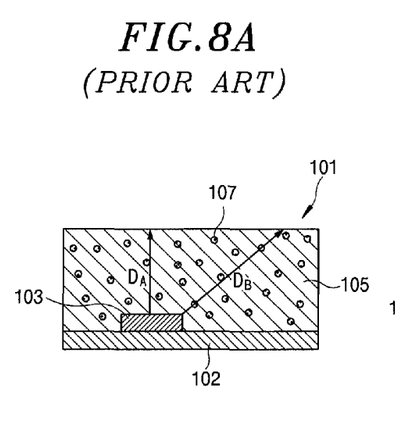
FIGS. 8A and 8B are sectional views used to explain paths of light in the conventional LED light sources.

An LED light source 101 shown in FIG. 8A includes a substrate 102, a solid-state light emitting element 103 mounted on the substrate 102, and a fluorescent layer 105 formed on the substrate 102. An LED light source 101 shown in FIG. 8B includes a substrate 102, two adjacent solid-state light emitting elements 103 mounted on the substrate 102, and fluorescent layers 105 potted on the solid-state light emitting elements 103, respectively.

As shown in FIG. 8A, assuming that blue light is emitted from the LED element 103, light emitted perpendicularly to a mounting surface of the substrate 102 is different from light emitted obliquely with respect to the mounting surface in terms of a distance of light propagation through the fluorescent layer 105. That is, a propagation distance "$D_B$" of the obliquely-emitted light is longer than a propagation distance "$D_A$" of the perpendicularly-emitted light and, accordingly, the wave conversion ratio of the obliquely-emitted light irradiated to fluorescent materials is higher than that of the perpendicularly-emitted light.

As a result, the obliquely-emitted light has more wavelength-converted yellow light components than blue light components and accordingly has low color temperature, which may cause the non-uniform color distribution.

Figure 8B:
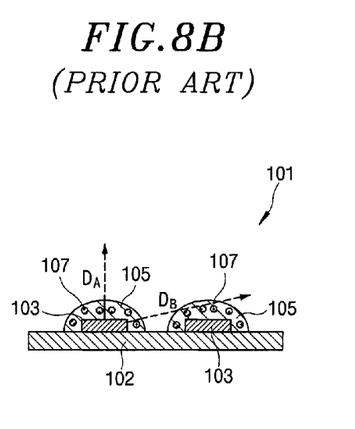

Light obliquely emitted from one of the adjacent LED elements 103 as shown in FIG. 8B propagates through a first fluorescent layer 105 covering the corresponding LED element 103 and a second fluorescent layer 105 covering the other LED element 103. This propagation is particularly likely to occur in a light emitting device including a plurality of LED elements arranged with high density. Accordingly, also in the case of the potting, the propagation distance $D_B$ of the obliquely-emitted light is longer than the propagation distance $D_A$ of the perpendicularly-emitted light, causing the same problem as mentioned above.

In order to prevent non-uniform color distribution, there has been proposed an illumination apparatus including a plurality of LED elements, a fluorescent layer and a V-like groove formed on a surface of the fluorescent layer along a section of the LED elements (see, e.g., Japanese Patent Application Publication No. 2011-60967 (JP2011-060967A). In the illumination apparatus, the propagation distance of obliquely-emitted light is reduced so that the propagation distance of obliquely-emitted light is equal to the propagation distance of perpendicularly-emitted light, as compared to a case where no V-like groove is provided.

However, it may be considered that the LED light source disclosed in JP2011-060967A causes the same problem as in the case of potting since light emitted from one LED element may propagate through the first fluorescent layer covering the corresponding LED element and the second fluorescent layer covering the other LED element.

SUMMARY OF THE INVENTION

In view of the above, the invention provides a light emitting device which is capable of obtaining a uniform irradiation pattern from a plurality of solid-state light emitting elements compactly mounted on a substrate, and an illumination apparatus including same.

In accordance with an aspect of the present invention, there is provided a light emitting device, including a plurality of solid-state light emitting elements mounted on a substrate; and a wavelength converting unit covering the solid-state light emitting elements, the wavelength converting unit containing fluorescent materials, wherein the solid-state light emitting elements include inner solid-state light emitting elements arranged in a central position of the substrate and outer solid-state light emitting elements arranged outwardly of the inner solid-state light emitting elements, and the wavelength converting unit is configured such that a probability that light propagating through the wavelength converting unit is brought into contact with the fluorescent materials in a portion of the wavelength converting unit covering the outer solid-state light emitting elements is lower than a probability that light propagating through the wavelength converting unit is brought into contact with the fluorescent materials in other portions.

The wavelength converting unit may be configured such that a concentration of the fluorescent materials in the portion covering the outer solid-state light emitting elements is lower than that in other portions.

The wavelength converting unit may be configured such that the concentration of the fluorescent materials in a portion covering a peripheral side of the outer solid-state light emitting elements is lower than that in other portions.

The wavelength converting unit may be configured such that a thickness of the portion covering the outer solid-state light emitting elements is smaller than that of other portions.

The wavelength converting unit may be configured such that a thickness of a portion covering a peripheral side of the outer solid-state light emitting elements is smaller than that of other portions.

An arrangement interval of the outer solid-state light emitting elements may be smaller than that of the inner solid-state light emitting elements.

In accordance with another aspect of the present invention, there is provided an illumination apparatus comprising a light emitting device.

With the light emitting device in accordance with the aspect of the present invention, the light emitted from the outer solid-state light emitting elements arranged in the peripheral position of the substrate is less likely to be wavelength-converted since the probability that light propagating through the wavelength converting unit is brought into contact with the fluorescent materials in the wavelength converting unit is low. In addition, the light emitted toward the periphery of the substrate from the inner solid-state light emitting elements arranged in the central position of the substrate is more likely to be wavelength-converted since the probability in the wavelength converting unit is high. As a result, a mixture of these emitted lights is emitted toward the periphery of the substrate, which can prevent non-uniform color distribution and achieve a uniform irradiation pattern.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1A:
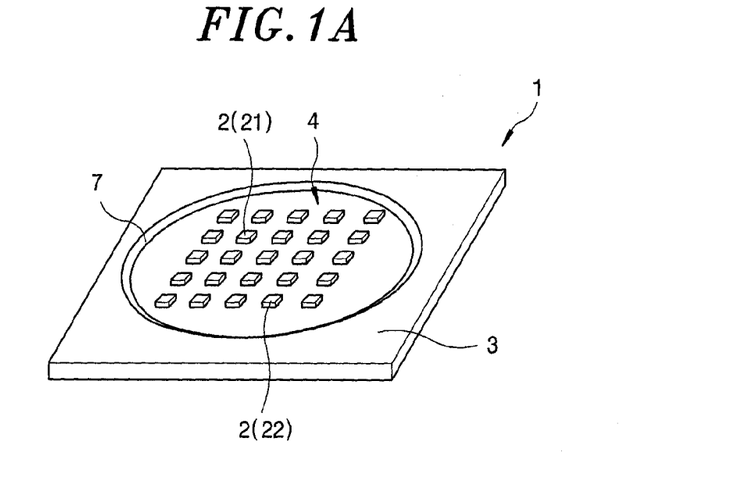
FIGS. 1A to 1C are a perspective view of a light emitting device in accordance with a first embodiment of the present invention, a sectional view thereof, and a partially-enlarged sectional view thereof, respectively.
Figure 1B:
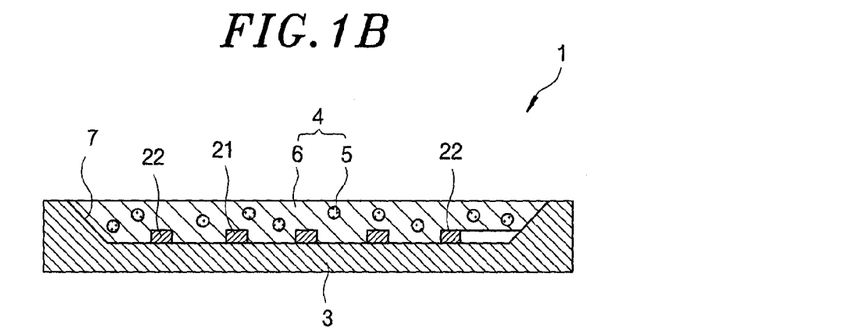
Figure 1C:
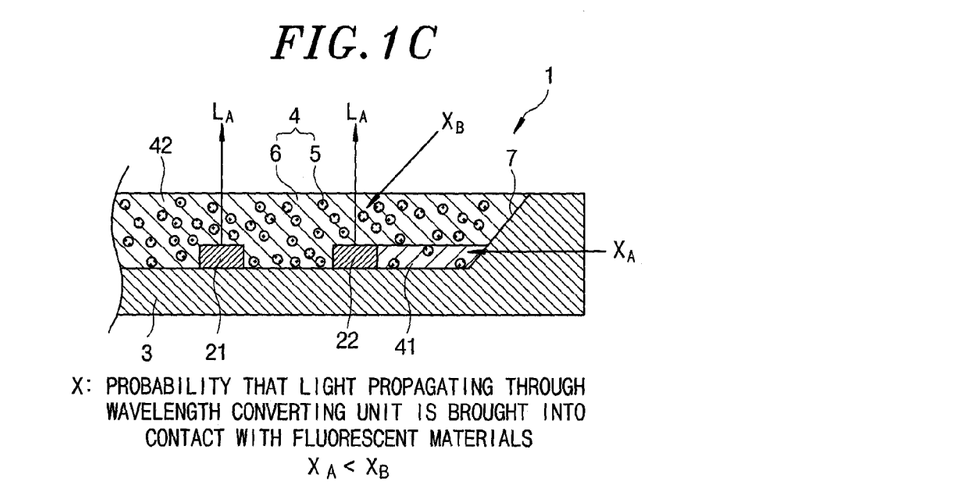

A light emitting device in accordance with a first embodiment of the present invention will now be described with reference to FIGS. 1A to 1C which form a part hereof. A light emitting device 1 includes a plurality of solid-state light emitting elements 2; a substrate 3 on which the solid-state light emitting elements 2 are mounted; and a wavelength converting unit 4 covering the solid-state light emitting elements 2. Although it is shown in FIG. 1A that the solid-state light emitting elements 2 are arranged in the form of a 5×5 matrix, the present invention is not limited thereto. The wavelength converting unit 4 includes fluorescent materials 5 such as yellow fluorescent materials or the like used for converting a wavelength of blue light emitted from, for example, a blue LED; and a binder 6 holding the fluorescent materials 5.

A circular concave portion 7 is formed on a surface of the substrate 3 and a wiring pattern (not shown) is formed on the bottom of the concave portion 7. The solid-state light emitting elements 2 are mounted on the bottom of the concave portion 7 by electrically connecting an electrode unit (not shown) to the wiring pattern.

The solid-state light emitting elements 2 include solid-state light emitting elements (hereinafter referred to as "inner LEDs") 21 arranged in the central position of the substrate 3; and solid-state light emitting elements (hereinafter referred to as "outer LEDs") 22 arranged outwardly of the inner LEDs 21. In this embodiment, for example, the inner LEDs 21 correspond to solid-state light emitting elements which are arranged in the central position of the substrate 3 and are surrounded by other ambient solid-state light emitting elements, and the outer LEDs 22 correspond to solid-state light emitting elements which are located in outermost positions without being surrounded by any solid-state light emitting element.

As used herein, "the central position" and "the peripheral position" refers to not an absolute positional relationship with respect to the substrate 3 but a relative positional relationship between the solid-state light emitting elements 2. Therefore, for example, if the substrate 3 is large with respect to a mounting area of the solid-state light emitting elements 2, "the solid-state light emitting elements arranged in the peripheral position" are located away from the periphery of the substrate 3. Accordingly, they may be considered to be arranged in the central position when viewed from a whole of the substrate 3.

In the example shown in FIG. 1A, the inner LEDs 21 are arranged on the bottom of the concave portion 7 in the form of a 3×3 matrix. The outer LEDs 22 are arranged in the form of such a frame as to surround the inner LEDs 21. With this arrangement, light emitted from the inner LEDs 21 toward the periphery of the substrate 3 has a longer propagation distance in the wavelength converting unit 4 than that emitted from the outer LEDs 22 and accordingly is more likely to be wavelength-converted by the fluorescent materials 5, which may result in increase in yellow light components to easily produce white light having low color temperature. In addition, a plurality of lights emitted from the inner LEDs 21 toward the periphery of the substrate is more superimposed than those emitted from the outer LEDs 22, which may have a great effect on color of lights irradiated toward the periphery of the light emitting device 1.

Examples of the solid-state light emitting elements 2 may include light emitting diodes to generate light having a band of wavelength of blue light (having a peak wavelength in a range from 430 nm to 470 nm). Alternatively, organic electro luminescent elements (e.g., organic light emitting diodes (OLEDs)) may be replaced with the light emitting diodes. The solid-state light emitting elements 2 may employ an optical control member to provide a wide distribution of output light.

An example of the substrate 3 may include a planar substrate made of, for example, ceramic, glass epoxy or the like. A reflective film made of a material having high reflectivity, such as silver, aluminum or the like, may be formed on the inner surface and the bottom surface of the concave portion 7. This allows light emitted from the solid-state light emitting elements 2 to be effectively diffused. The arrangement of the solid-state light emitting elements 2 may be, for example, of a line form or a zigzag form without being limited to the matrix form. The arrangement of the line form can simplify a mounting process of the solid-state light emitting elements 2, and the arrangement of the zigzag form can effectively dissipate heat generated in the solid-state light emitting elements 2. An interval of arrangement of adjacent solid-state light emitting elements 2 is properly set in consideration of heat dissipation although the smaller interval can provide higher emission efficiency.

The wavelength converting unit 4 is filled in the concave portion of the substrate 3 to cover the inner LEDs and the outer LEDs 22. In this example, a portion covering a peripheral side of the outer LEDs 22 is referred to as a first wavelength converting section 41, and the other portion is referred to as a second wavelength converting section 42. The wavelength converting unit 4 is configured such that a probability "X" that light propagating through the wavelength converting unit is brought into contact with the fluorescent materials 5 in the portion covering the outer LEDs 22 is lower than the probability X in the other portion.

In this embodiment, the first wavelength converting section 41 and the second wavelength converting section 42 are configured such that a probability "$X_A$" that light propagating through the wavelength converting unit is brought into contact with the fluorescent materials 5 in the first wavelength converting section 41 is lower than a probability "$X_B$" that light propagating through the wavelength converting unit is brought into contact with the fluorescent materials 5 in the second wavelength converting section 42. That is, the ratio by which light propagating into the first wavelength converting section 41 toward the periphery of the substrate 3 is wavelength-converted by the contact with the fluorescent materials 5 is lower than the ratio by which light propagating into the second wavelength converting section 42 is wavelength-converted. Accordingly, the light propagating into the first wavelength converting section 41 has more blue light components, which results in white light having higher color temperature.

In contrast, the ratio by which light propagating into the second wavelength converting section 42 toward the periphery of the substrate 3 is wavelength-converted is higher than the ratio by which light propagating into the first wavelength converting section 41 is wavelength-converted. Accordingly, the light propagating into the second wavelength converting section 42 has more yellow light components, which results in white light having lower color temperature.

The fluorescent materials 5 are dispersed in the binder 6, so that blue light guided along the binder 6 is wavelength-converted into light whose an emission peak ranges between green light having a long wavelength and red light. It is preferable that yellow fluorescent materials are used to obtain white light, and a combination of green fluorescent materials and red fluorescent materials is used to obtain white light having higher color rendition.

The binder 6 serves as a main part of the wavelength converting unit 4. A diffusing material may be mixed with the binder 6 as necessary. This allows light emitted from the solid-state light emitting elements 2 to be effectively diffused. An example of the diffusing material may include a material having an average diameter of 1 μm, for example, an inorganic material such as aluminum oxide or silica and an organic material such as fluorine resin. Depending on the arrangement of the solid-state light emitting elements 2, the binder 6 is formed in such a way as to cover the solid-state light emitting elements 2 in the form of a line or is potted on the solid-state light emitting elements 2 in a predetermined form.

Although lights are emitted from the inner LEDs 21 and the outer LEDs 22 in a radial form with regard to light "$L_A$" emitted perpendicularly to the mounting surface of the substrate 3, the perpendicularly-emitted light $L_A$ typically has the greatest light flux. The light $L_A$ transmits through the second wavelength converting section 42 and is wavelength-converted to serve as main radiation light from the light emitting device 1. In this embodiment, concentration, thickness and species mixture ratio of the fluorescent materials 5 in the second wavelength converting section 42 are properly adjusted such that the perpendicularly-emitted light $L_A$ becomes white light having desired color temperature.

In this embodiment, the probability $X_A$ in the first wavelength converting section 41, which is smaller than the probability "$X_B$" in the second wavelength converting section 42, is set by adjusting the concentration of the fluorescent materials 5. Specifically, in order to reduce the probability $X_A$ in the first wavelength converting section 41, the concentration of the fluorescent materials 5 in the first wavelength converting section 41 is set to be smaller than that in the second wavelength converting section 42. This allows the probability $X_A$ in the first wavelength converting section 41 to be lower than the probability "$X_B$" in the second wavelength converting section 42 without changing a shape of the first wavelength converting section 41. This configuration may be particularly useful if a formation space of the wavelength converting unit 4 is limited.

An example of a method of reducing the probability $X_A$ may include a method of adjusting thickness of the wavelength converting unit 4, specifically a method of making the thickness of the first wavelength converting section 41 smaller than that of the second wavelength converting section 42, in addition to the above-described method of adjusting the concentration of the fluorescent materials 5. This method allows the absolute amount of the fluorescent materials 5 in the first wavelength converting section 41 toward the periphery of the substrate 3 to be smaller than that in the second wavelength converting section 42 and accordingly allows the probability $X_A$ in the first wavelength converting section 41 to be lower than the probability "$X_B$" in the second wavelength converting section 42. This method may be particularly useful if the formation space of the wavelength converting unit 4 is not limited.

Figure 2:
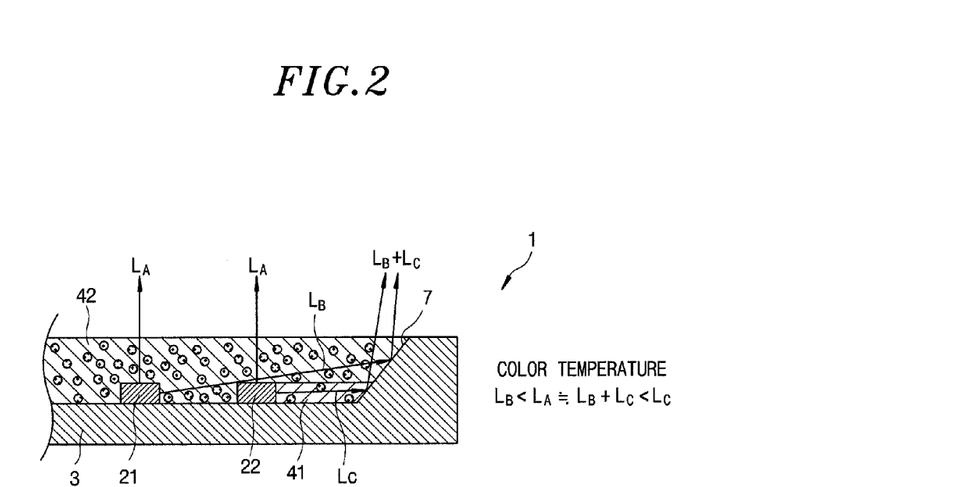
FIG. 2 is a sectional view used to explain an operation of the light emitting device.

Next, an operation of the light emitting device 1 will be described with reference to FIG. 2. The light $L_A$ emitted perpendicularly to the mounting surface of the substrate 3 from the inner LEDs 21 and the outer LEDs 22 becomes the white light having desired color temperature since the second wavelength converting section 42 is configured as described above.

Light "$L_B$" emitted from the inner LEDs 21 toward the periphery of the substrate 3 propagates through the second wavelength converting section 42 in an oblique direction and is reflected by the inner side surface of the concave portion 7. At this time, since the emitted light $L_B$ has a longer propagation distance and a higher ratio by which the emitted light $L_B$ is wavelength-converted by the fluorescent materials 5 than those of light "$L_C$" emitted from the outer LEDs 22 toward the periphery of the substrate 3, the light $L_B$ has more yellow light components, which results in white light having lower color temperature.

The light $L_C$ emitted from the outer LEDs 22 toward the periphery of the substrate 3 propagates through the first wavelength converting section 41 and is reflected by the inside of the concave portion 7. At this time, since the emitted light $L_C$ has a shorter propagation distance and a lower ratio by which the emitted light $L_C$ is wavelength-converted by the fluorescent materials 5 than those of light $L_B$ emitted from the inner LEDs 21 toward the periphery of the substrate 3, the light $L_C$ has more blue light components, which results in white light having higher color temperature.

A mixture of the white light $L_B$ having the lower color temperature and the white light $L_C$ having the higher color temperature has substantially the same color temperature as the white light $L_A$ which is not biased to either color temperature and is guided out of the light emitting device 1.

In accordance with the light emitting device 1 of this embodiment, the light $L_B$ emitted from the outer LEDs 22 is less likely to be wavelength-converted by the first wavelength converting section 41, and the light $L_C$ emitted from the inner LEDs 21 toward the periphery of the substrate is more likely to be wavelength-converted by the second wavelength converting section 42 than the light $L_B$ emitted from the outer LEDs 22. A mixture ($L_B+L_C$) of the lights $L_B$ and $L_C$ are emitted toward the periphery of the substrate 3 and has a small difference in color temperature from lights (mainly the white light $L_A$) in directions other than the direction toward the periphery, which may result in a low possibility of non-uniform color distribution and a uniform irradiation pattern. This light emitting device 1 can be used as an illumination apparatus for emitting light having a uniform irradiation pattern.

Figure 3:
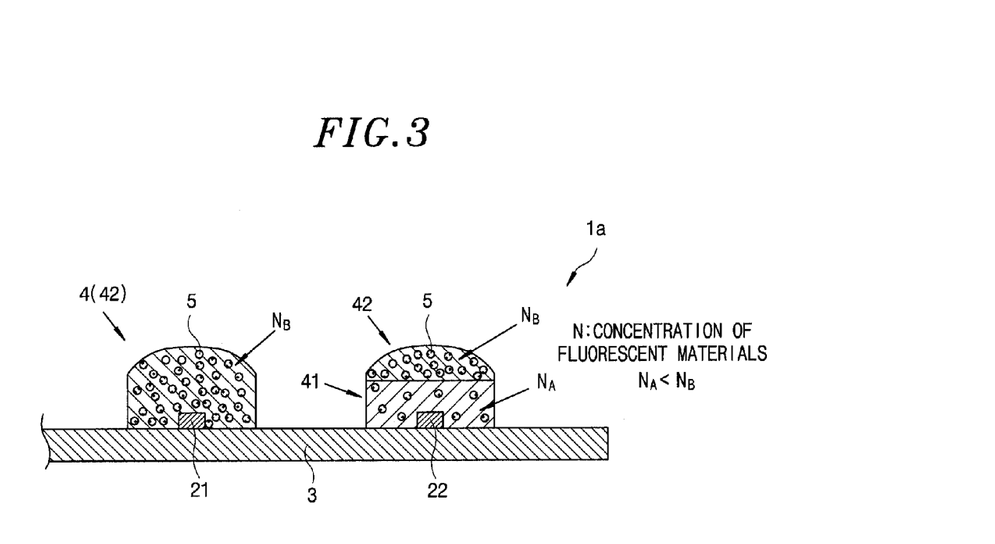
FIG. 3 is a sectional view of a light emitting device in accordance with a second embodiment of the present invention.

Next, a light emitting device in accordance with a second embodiment will be described with reference to FIG. 3. A light emitting device 1a in accordance with this embodiment is configured such that the solid-state light emitting elements 2 (21 and 22) are covered with respective wavelength converting units 4 instead of being covered by the single wavelength converting unit 4 collectively. The respective wavelength converting units 4 are formed by potting.

The concentration of the fluorescent materials 5 of the wavelength converting units 4 covering the outer LEDs 22 is set to be lower than those of other portions. Specifically, the outer LEDs 22 are covered with the first wavelength converting unit 41 including the fluorescent materials 5 of a concentration $N_A$, and the first wavelength converting section 41 and the inner LEDs 21 are respectively covered with the second wavelength converting units 42 including the fluorescent materials 5 of a concentration $N_B$ ($N_A<N_B$). Other configurations are the same as those in the first embodiment. FIG. 3 shows only one outer LED 22, one inner LED 21 and the wavelength converting units 4 covering these LEDs 22 and 21 on the substrate 3.

With this configuration, the concentration of the fluorescent materials 5 in the first wavelength converting section 41 is lower than those in the second wavelength converting sections 42 covering the inner LEDs 21, so that the light emitted from the outer LEDs 22 toward the periphery is less likely to be wavelength-converted by the fluorescent materials 5 and accordingly have more blue light components, which results in white light having higher color temperature.

In contrast, since the concentration of the fluorescent materials 5 in the second wavelength converting section 42 is higher than that in the first wavelength converting section 41 and the light emitted from the inner LEDs 21 toward the periphery propagate through the wavelength converting sections 4, this light is more likely to be wavelength-converted and accordingly have more yellow light components, which results in white light having lower color temperature. A mixture of these lights is emitted out of the light emitting device 1a. Accordingly, in this embodiment, it is also possible to prevent non-uniform color distribution and achieve a uniform irradiation pattern, as in the first embodiment.

Figure 4:
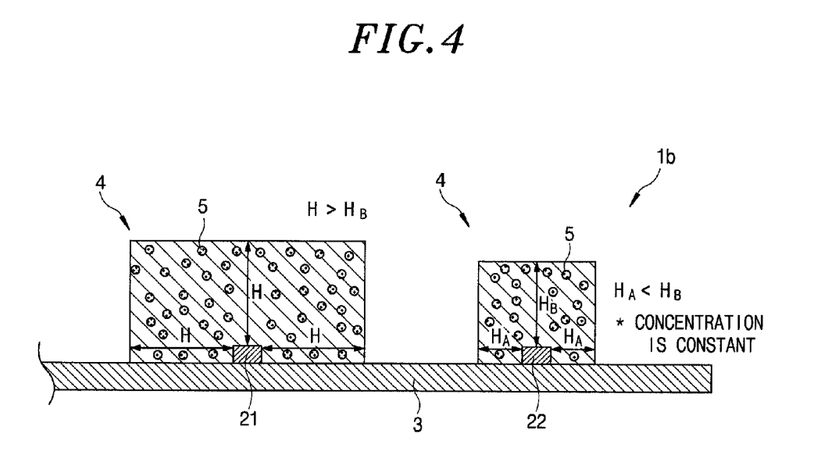
FIG. 4 is a sectional view of a light emitting device in accordance with a third embodiment of the present embodiment.

Next, a light emitting device in accordance with a third embodiment will be described with reference to FIG. 4. A light emitting device 1b in accordance with this embodiment is configured such that the thickness of a portion of the wavelength converting unit 4 covering the outer LEDs 22 is smaller than that of other portions. In this embodiment, it is assumed that the horizontal thickness of the portion covering the outer LEDs 22 is "$H_A$," the vertical thickness thereof is "$H_B$ ($>H_A$)" and the horizontal and vertical thicknesses of the portion covering the inner LEDs 21 is "H ($>H_B$)." The concentration of the fluorescent materials 5 in the wavelength converting unit 4 covering the inner LEDs 21 and the outer LEDs 22 is constant. That is, in this embodiment, the probability X is set by adjusting the thickness of the wavelength converting unit 4. Other configurations are the same as those in the second embodiment.

With this configuration, light emitted from the outer LEDs 22 toward the periphery has a shorter propagation distance than light emitted from the inner LEDs 21 and is less likely to be wavelength-converted by the fluorescent materials 5, and accordingly have more blue light components, which results in white light having higher color temperature. In contrast, light emitted from the inner LEDs 21 toward the periphery has a longer propagation distance than light emitted from the outer LEDs 22, propagates through the wavelength converting unit 4 covering the outer LEDs 22 and is more likely to be wavelength-converted by the fluorescent materials 5 and accordingly have more yellow light components, which results in white light having lower color temperature. A mixture of these white lights is emitted out of the light emitting device 1b. Accordingly, in this embodiment, it is also possible to prevent non-uniform color distribution and achieve a uniform irradiation pattern, as in the second embodiment.

Figure 5A:
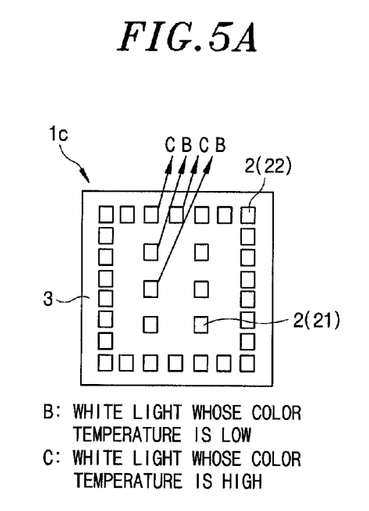
FIGS. 5A and 5B are a plan view of a light emitting device in accordance with a fourth embodiment of the present invention, and a plan view of a light emitting device including a plurality of solid-state elements arranged at equal intervals, as a reference example, respectively.

Next, a light emitting device in accordance with a fourth embodiment will be described with reference to FIGS. 5A and 5B. As shown in FIG. 5A, a light emitting device 1c in accordance with this embodiment is configured such that an interval at which the outer LEDs 22 are arranged on the substrate 3 is smaller than an interval at which the inner LEDs 22 are arranged. The wavelength converting unit 4 is not particularly limited in its shape but may be formed by coating a plurality of solid-state light emitting elements collectively, as shown in the first embodiment, or by the potting as shown in the second embodiment.

In addition, the inner LEDs 21 may be different in thickness from the outer LEDs 22, as in the third embodiment. Other configurations are the same as those in the first to third embodiments. FIGS. 5A and 5B show only the solid-state light emitting elements 2 mounted on the substrate 3.

Figure 5B:
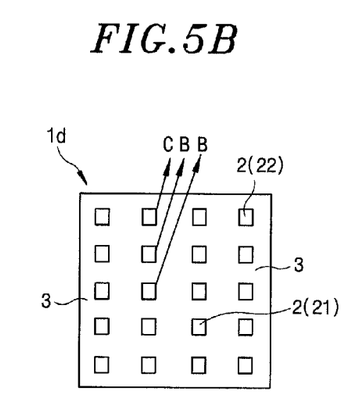

FIG. 5B shows a reference example of this embodiment. A light emitting device 1d of this reference example is configured such that a plurality of solid-state light emitting elements 2 is arranged on the substrate at equal intervals. With this configuration, a plurality of lights emitted from the inner LEDs 21 toward the periphery of the substrate 3 is more superimposed than those emitted from the outer LEDs 22. This causes a light flux "B" emitted from the inner LEDs 21 to be greater than a light flux "C" emitted from the outer LEDs 22, as shown in FIG. 5B.

In contrast, in this embodiment, the light flux C emitted from the outer LEDs 22 becomes equal to the light flux B emitted from the inner LEDs 21 by increasing the number of outer LEDs 22. That is, the light flux B of the white light having lower color temperature from the inner LEDs 21 becomes equal to the light flux C of the white light having higher color temperature from the outer LEDs 22. Accordingly, since light emitted from the light emitting device 1c toward the periphery is not biased to white light components having higher color temperature or white light components having lower color temperature, it is possible to further improve a uniform irradiation pattern of the light emitting device 1c.

While the invention has been shown and described with respect to the embodiments, it will be understood by those skilled in the art that various changes and modifications may be made without departing from the scope of the invention as defined in the following claims. For example, although it has been illustrated in the above that the outer LEDs 22 are arranged in the outermost positions of the substrate 3, the arrangement of the outer LEDs 22 is not particularly limited as long as they are arranged in the outer side of solid-state light emitting elements arranged in the central position of the substrate 3.

What is claimed is:

1. A light emitting device, comprising:
   a plurality of solid-state light emitting elements mounted on a substrate; and
   a wavelength converting unit covering the solid-state light emitting elements, the wavelength converting unit containing fluorescent materials,
   wherein the solid-state light emitting elements include inner solid-state light emitting elements arranged in a central position of the substrate and outer solid-state light emitting elements arranged outwardly of the inner solid-state light emitting elements, and
   the wavelength converting unit is configured such that a probability that light propagating through the wavelength converting unit is brought into contact with the fluorescent materials in a portion of the wavelength converting unit covering the outer solid-state light emitting elements is lower than a probability that light propagating through the wavelength converting unit is brought into contact with the fluorescent materials in other portions.

2. The light emitting device of claim 1, wherein the wavelength converting unit is configured such that a concentration of the fluorescent materials in the portion covering the outer solid-state light emitting elements is lower than that in other portions.

3. The light emitting device of claim 2, wherein the wavelength converting unit is configured such that the concentration of the fluorescent materials in a portion covering a peripheral side of the outer solid-state light emitting elements is lower than that in other portions.

4. The light emitting device of claim 1, wherein the wavelength converting unit is configured such that a thickness of the portion covering the outer solid-state light emitting elements is smaller than that of other portions.

5. The light emitting device of claim 4, wherein the wavelength converting unit is configured such that a thickness of a portion covering a peripheral side of the outer solid-state light emitting elements is smaller than that of other portions.

6. The light emitting device of claim 1, wherein an arrangement interval of the outer solid-state light emitting elements is smaller than that of the inner solid-state light emitting elements.

7. An illumination apparatus comprising a light emitting device of claim 1.

* * * * *